(12) United States Patent
Ko et al.

(10) Patent No.: US 10,424,487 B2
(45) Date of Patent: Sep. 24, 2019

(54) ATOMIC LAYER ETCHING PROCESSES

(71) Applicant: Applied Materials, Inc., Santa Clara, CA (US)

(72) Inventors: Jungmin Ko, San Jose, CA (US); Tom Choi, Sunnyvale, CA (US); Junghoon Kim, Santa Clara, CA (US); Sean Kang, San Ramon, CA (US); Mang-Mang Ling, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/792,252

(22) Filed: Oct. 24, 2017

(65) Prior Publication Data

US 2019/0122902 A1    Apr. 25, 2019

(51) Int. Cl.
*H01L 21/3065* (2006.01)
*H01L 21/67* (2006.01)
(Continued)

(52) U.S. Cl.
CPC .... *H01L 21/3065* (2013.01); *H01J 37/32357* (2013.01); *H01J 37/32449* (2013.01);
(Continued)

(58) Field of Classification Search
None
See application file for complete search history.

(56) References Cited

U.S. PATENT DOCUMENTS

| 4,190,488 A | 2/1980 | Winters |
| 4,867,841 A | 9/1989 | Loewenstein et al. |

(Continued)

FOREIGN PATENT DOCUMENTS

| CN | 102893705 | 1/2013 |
| JP | S62-45119 A | 2/1987 |

(Continued)

OTHER PUBLICATIONS

Won et al. Derwent 2006-065772; Sep. 7, 2014, 10 pages.
(Continued)

*Primary Examiner* — Jiong-Ping Lu
(74) *Attorney, Agent, or Firm* — Kilpatrick Townsend & Stockton LLP

(57) ABSTRACT

Processing methods may be performed to remove unwanted materials from a substrate. The methods may include forming a remote plasma of an inert precursor in a remote plasma region of a processing chamber. The methods may include forming a bias plasma of the inert precursor within a processing region of the processing chamber. The methods may include modifying a surface of an exposed material on a semiconductor substrate within the processing region of the processing chamber with plasma effluents of the inert precursor. The methods may include extinguishing the bias plasma while maintaining the remote plasma. The methods may include adding an etchant precursor to the remote plasma region to produce etchant plasma effluents. The methods may include flowing the etchant plasma effluents to the processing region of the processing chamber. The methods may also include removing the modified surface of the exposed material from the semiconductor substrate.

19 Claims, 5 Drawing Sheets

(51) Int. Cl.
*H01J 37/32* (2006.01)
*H01L 21/3213* (2006.01)
*H01L 21/311* (2006.01)

(52) U.S. Cl.
CPC .. *H01J 37/32899* (2013.01); *H01L 21/31116* (2013.01); *H01L 21/32136* (2013.01); *H01L 21/67069* (2013.01); *H01J 2237/334* (2013.01); *H01J 2237/3341* (2013.01)

(56) References Cited

U.S. PATENT DOCUMENTS

| | | | |
|---|---|---|---|
| 4,919,750 A | 4/1990 | Bausmith et al. |
| 5,010,842 A | 4/1991 | Oda et al. |
| 5,069,938 A | 12/1991 | Lorimer et al. |
| 5,200,016 A | 4/1993 | Namose |
| 5,221,427 A | 6/1993 | Koinuma et al. |
| 5,290,383 A | 3/1994 | Koshimizu |
| 5,366,585 A | 11/1994 | Robertson et al. |
| 5,494,494 A | 2/1996 | Mizuno et al. |
| 5,597,439 A | 1/1997 | Salzman |
| 5,868,897 A | 2/1999 | Ohkawa |
| 5,935,340 A | 8/1999 | Xia et al. |
| 5,963,840 A | 10/1999 | Xia et al. |
| 5,968,587 A | 10/1999 | Frankel et al. |
| 5,994,209 A | 11/1999 | Yieh et al. |
| 5,997,649 A | 12/1999 | Hillman |
| 6,019,848 A | 2/2000 | Kiyama et al. |
| 6,039,834 A | 3/2000 | Tanaka et al. |
| 6,074,514 A | 6/2000 | Bjorkman et al. |
| 6,079,356 A | 6/2000 | Umotoy et al. |
| 6,114,216 A | 9/2000 | Yieh et al. |
| 6,148,761 A | 11/2000 | Majewski et al. |
| 6,161,500 A | 12/2000 | Kopacz et al. |
| 6,162,370 A | 12/2000 | Hackett et al. |
| 6,174,810 B1 | 1/2001 | Patrick et al. |
| 6,182,603 B1 | 2/2001 | Shang et al. |
| 6,225,745 B1 | 5/2001 | Srivastava |
| 6,302,964 B1 | 10/2001 | Umotoy et al. |
| 6,308,654 B1 | 10/2001 | Schneider et al. |
| 6,310,755 B1 | 10/2001 | Busato et al. |
| 6,429,465 B1 | 8/2002 | Yagi et al. |
| 6,462,372 B1 | 10/2002 | Xia et al. |
| 6,465,350 B1 | 10/2002 | Taylor et al. |
| 6,509,283 B1 | 1/2003 | Thomas |
| 6,602,806 B1 | 8/2003 | Xia et al. |
| 6,635,575 B1 | 10/2003 | Xia et al. |
| 6,736,147 B2 | 5/2004 | Satoh et al. |
| 6,736,987 B1 | 5/2004 | Cho |
| 6,740,247 B1 | 5/2004 | Han et al. |
| 6,815,633 B1 | 11/2004 | Chen et al. |
| 6,852,584 B1 | 2/2005 | Chen et al. |
| 6,969,619 B1 | 11/2005 | Winniczek |
| 7,274,004 B2 | 9/2007 | Benjamin et al. |
| 7,479,303 B2 | 1/2009 | Byun et al. |
| 7,780,790 B2 | 8/2010 | Nogami |
| 7,977,249 B1 | 7/2011 | Liu |
| 8,222,128 B2 | 7/2012 | Sasaki et al. |
| 8,298,959 B2 | 10/2012 | Cheshire |
| 8,329,262 B2 | 12/2012 | Miller et al. |
| 8,361,892 B2 | 1/2013 | Tam et al. |
| 8,466,073 B2 | 6/2013 | Wang et al. |
| 8,633,423 B2 | 1/2014 | Lin et al. |
| 8,642,481 B2 | 2/2014 | Wang et al. |
| 8,668,836 B2 | 3/2014 | Mizukami et al. |
| 8,815,720 B2 | 8/2014 | Godet et al. |
| 8,894,767 B2 | 11/2014 | Goradia et al. |
| 8,932,947 B1 | 1/2015 | Han et al. |
| 8,937,017 B2 | 1/2015 | Cheshire et al. |
| 8,945,414 B1 | 2/2015 | Su et al. |
| 9,093,389 B2 | 7/2015 | Nemani |
| 9,190,290 B2 | 11/2015 | Xue et al. |
| 9,202,708 B1 | 12/2015 | Chen et al. |
| 9,362,163 B2 | 6/2016 | Danek et al. |
| 9,396,961 B2 | 7/2016 | Arghavani et al. |
| 9,425,041 B2 | 8/2016 | Berry et al. |
| 9,343,358 B2 | 9/2016 | Montgomery |
| 9,460,959 B1 | 10/2016 | Xie et al. |
| 9,478,433 B1 | 10/2016 | Zhou et al. |
| 9,576,788 B2 | 2/2017 | Liu et al. |
| 9,659,791 B2 | 5/2017 | Wang et al. |
| 9,779,956 B1 | 10/2017 | Zhang et al. |
| 9,822,009 B2 | 11/2017 | Kagaya et al. |
| 9,831,097 B2 | 11/2017 | Ingle et al. |
| 9,837,249 B2 | 12/2017 | Kobayashi et al. |
| 9,837,284 B2 | 12/2017 | Chen et al. |
| 9,837,286 B2 | 12/2017 | Yang et al. |
| 9,842,744 B2 | 12/2017 | Zhang et al. |
| 9,865,484 B1 | 1/2018 | Citla et al. |
| 9,881,805 B2 | 1/2018 | Li et al. |
| 9,885,117 B2 | 2/2018 | Lubomirsky et al. |
| 9,887,096 B2 | 2/2018 | Park et al. |
| 9,903,020 B2 | 2/2018 | Kim et al. |
| 9,934,942 B1 | 4/2018 | Lubomirsky |
| 9,947,549 B1 | 4/2018 | Park et al. |
| 9,966,240 B2 | 5/2018 | Park et al. |
| 9,978,564 B2 | 5/2018 | Liang et al. |
| 9,991,134 B2 | 6/2018 | Wang et al. |
| 10,026,621 B2 | 7/2018 | Ko et al. |
| 10,032,606 B2 | 7/2018 | Yang et al. |
| 10,043,674 B1 | 8/2018 | Korolik et al. |
| 10,043,684 B1 | 8/2018 | Arnepalli et al. |
| 10,049,891 B1 | 8/2018 | Wang et al. |
| 10,062,578 B2 | 8/2018 | Zhang et al. |
| 10,062,579 B2 | 8/2018 | Chen et al. |
| 10,062,585 B2 | 8/2018 | Lubomirsky |
| 10,062,587 B2 | 8/2018 | Chen et al. |
| 2001/0015175 A1 | 8/2001 | Masuda et al. |
| 2001/0029891 A1 | 10/2001 | Oh et al. |
| 2001/0047760 A1 | 12/2001 | Moslehi |
| 2001/0054387 A1 | 12/2001 | Frankel et al. |
| 2002/0009560 A1 | 1/2002 | Ozono |
| 2002/0009885 A1 | 1/2002 | Brankner et al. |
| 2002/0170678 A1 | 11/2002 | Hayashi et al. |
| 2002/0197823 A1 | 12/2002 | Yoo et al. |
| 2003/0000647 A1 | 1/2003 | Yudovsky et al. |
| 2003/0031905 A1 | 2/2003 | Saito et al. |
| 2003/0066482 A1 | 4/2003 | Pokharna et al. |
| 2003/0077857 A1 | 4/2003 | Xia et al. |
| 2003/0150530 A1 | 8/2003 | Lin et al. |
| 2003/0196760 A1 | 10/2003 | Tyler et al. |
| 2003/0205479 A1 | 11/2003 | Lin et al. |
| 2003/0215570 A1 | 11/2003 | Seutter et al. |
| 2004/0003828 A1 | 1/2004 | Jackson |
| 2004/0060514 A1 | 4/2004 | Janakiraman et al. |
| 2004/0103844 A1 | 6/2004 | Chou et al. |
| 2004/0124280 A1 | 7/2004 | Shih et al. |
| 2004/0144311 A1 | 7/2004 | Chen et al. |
| 2004/0149223 A1 | 8/2004 | Collison et al. |
| 2004/0195216 A1 | 10/2004 | Strang |
| 2004/0219723 A1 | 11/2004 | Peng et al. |
| 2004/0221809 A1 | 11/2004 | Ohmi et al. |
| 2004/0237897 A1 | 12/2004 | Hanawa et al. |
| 2005/0056218 A1 | 3/2005 | Sun et al. |
| 2005/0109279 A1 | 5/2005 | Suzuki |
| 2005/0123690 A1 | 6/2005 | Derderian et al. |
| 2005/0178746 A1 | 8/2005 | Gorin |
| 2005/0194094 A1 | 9/2005 | Yasaka |
| 2005/0208217 A1 | 9/2005 | Shinriki et al. |
| 2005/0217582 A1 | 10/2005 | Kim et al. |
| 2005/0229848 A1 | 10/2005 | Shinriki et al. |
| 2005/0283321 A1 | 12/2005 | Yue et al. |
| 2005/0287688 A1 | 12/2005 | Won et al. |
| 2006/0008676 A1 | 1/2006 | Ebata et al. |
| 2006/0021701 A1 | 2/2006 | Tobe et al. |
| 2006/0057828 A1 | 3/2006 | Omura et al. |
| 2006/0073349 A1 | 4/2006 | Aihara et al. |
| 2006/0076108 A1 | 4/2006 | Holland et al. |
| 2006/0090700 A1 | 5/2006 | Satoh et al. |
| 2006/0113038 A1 | 6/2006 | Gondhalekar et al. |
| 2006/0118240 A1 | 6/2006 | Holber et al. |
| 2006/0124151 A1 | 6/2006 | Yamasaki et al. |
| 2006/0151115 A1 | 7/2006 | Kim et al. |
| 2006/0169410 A1 | 8/2006 | Maeda et al. |

(56) References Cited

U.S. PATENT DOCUMENTS

| | | |
|---|---|---|
| 2006/0183270 A1 | 8/2006 | Humpston |
| 2006/0210713 A1 | 9/2006 | Brcka |
| 2006/0245852 A1 | 11/2006 | Iwabuchi |
| 2006/0286774 A1 | 12/2006 | Singh et al. |
| 2006/0289384 A1 | 12/2006 | Pavel et al. |
| 2007/0051471 A1 | 3/2007 | Kawaguchi et al. |
| 2007/0066084 A1 | 3/2007 | Wajda et al. |
| 2007/0077737 A1 | 4/2007 | Kobayashi |
| 2007/0232071 A1 | 10/2007 | Balseanu et al. |
| 2008/0003836 A1 | 1/2008 | Nishimura et al. |
| 2008/0035608 A1 | 2/2008 | Thomas et al. |
| 2008/0044593 A1 | 2/2008 | Seo et al. |
| 2008/0102646 A1 | 5/2008 | Kawaguchi et al. |
| 2008/0156631 A1 | 7/2008 | Fair et al. |
| 2008/0178805 A1 | 7/2008 | Paterson et al. |
| 2008/0196666 A1 | 8/2008 | Toshima |
| 2009/0095221 A1 | 4/2009 | Tam et al. |
| 2009/0095222 A1 | 4/2009 | Tam et al. |
| 2009/0117270 A1 | 5/2009 | Yamasaki et al. |
| 2009/0189287 A1 | 7/2009 | Yang et al. |
| 2009/0191711 A1 | 7/2009 | Rui et al. |
| 2009/0194233 A1 | 8/2009 | Tamura |
| 2009/0236314 A1 | 9/2009 | Chen |
| 2009/0286405 A1 | 11/2009 | Okesaku et al. |
| 2009/0293809 A1 | 12/2009 | Cho et al. |
| 2010/0006543 A1 | 1/2010 | Sawada et al. |
| 2010/0025370 A1 | 2/2010 | Dieguez-Campo et al. |
| 2010/0243165 A1 | 9/2010 | Um |
| 2010/0244204 A1 | 9/2010 | Matsuoka et al. |
| 2010/0267224 A1 | 10/2010 | Choi et al. |
| 2010/0267248 A1 | 10/2010 | Ma et al. |
| 2010/0273290 A1 | 10/2010 | Kryliouk |
| 2010/0273291 A1 | 10/2010 | Kryliouk et al. |
| 2010/0310785 A1 | 12/2010 | Sasakawa et al. |
| 2010/0314005 A1 | 12/2010 | Saito et al. |
| 2011/0005684 A1 | 1/2011 | Hayami et al. |
| 2011/0204025 A1 | 8/2011 | Tahara |
| 2011/0207332 A1 | 8/2011 | Liu et al. |
| 2011/0244686 A1 | 10/2011 | Aso et al. |
| 2011/0244693 A1 | 10/2011 | Tamura et al. |
| 2011/0265887 A1 | 11/2011 | Lee et al. |
| 2012/0040492 A1 | 2/2012 | Ovshinsky et al. |
| 2012/0055402 A1 | 3/2012 | Moriya et al. |
| 2012/0070982 A1 | 3/2012 | Yu et al. |
| 2012/0070996 A1 | 3/2012 | Hao et al. |
| 2012/0100720 A1 | 4/2012 | Winniczek et al. |
| 2012/0122319 A1 | 5/2012 | Shimizu |
| 2012/0171852 A1 | 7/2012 | Yuan et al. |
| 2012/0187844 A1 | 7/2012 | Hoffman et al. |
| 2012/0196451 A1 | 8/2012 | Mallick |
| 2012/0222616 A1 | 9/2012 | Han et al. |
| 2012/0234945 A1 | 9/2012 | Olgado |
| 2012/0238108 A1 | 9/2012 | Chen et al. |
| 2012/0255491 A1 | 10/2012 | Hadidi |
| 2012/0269968 A1 | 10/2012 | Rayner |
| 2012/0291696 A1 | 11/2012 | Clarke |
| 2012/0304933 A1 | 12/2012 | Mai et al. |
| 2012/0309205 A1 | 12/2012 | Wang et al. |
| 2012/0322015 A1 | 12/2012 | Kim |
| 2013/0023062 A1 | 1/2013 | Masuda et al. |
| 2013/0037919 A1 | 2/2013 | Sapra et al. |
| 2013/0155568 A1 | 6/2013 | Todorow et al. |
| 2013/0224953 A1 | 8/2013 | Salinas et al. |
| 2014/0053866 A1 | 2/2014 | Baluja et al. |
| 2014/0134842 A1 | 5/2014 | Zhange et al. |
| 2014/0199850 A1 | 7/2014 | Kim et al. |
| 2014/0216337 A1 | 8/2014 | Swaminathan et al. |
| 2014/0264507 A1 | 9/2014 | Lee et al. |
| 2014/0342569 A1* | 11/2014 | Zhu ................ H01L 21/3065 438/710 |
| 2014/0363979 A1 | 12/2014 | Or et al. |
| 2015/0041430 A1 | 2/2015 | Yoshino et al. |
| 2015/0050812 A1 | 2/2015 | Smith |
| 2015/0064918 A1 | 3/2015 | Ranjan et al. |
| 2015/0118822 A1 | 4/2015 | Zhang et al. |
| 2015/0221479 A1 | 8/2015 | Chen et al. |
| 2015/0228456 A1 | 8/2015 | Ye et al. |
| 2015/0279687 A1 | 10/2015 | Xue et al. |
| 2016/0043099 A1 | 2/2016 | Purayath et al. |
| 2016/0064212 A1 | 3/2016 | Thedjoisworo et al. |
| 2016/0079062 A1 | 3/2016 | Zheng et al. |
| 2016/0093737 A1 | 3/2016 | Li et al. |
| 2016/0118396 A1 | 4/2016 | Rabkin et al. |
| 2016/0133480 A1 | 5/2016 | Ko et al. |
| 2016/0148805 A1 | 5/2016 | Jongbloed et al. |
| 2016/0196985 A1 | 7/2016 | Tan et al. |
| 2016/0307773 A1 | 10/2016 | Lee et al. |
| 2016/0319452 A1 | 11/2016 | Eidschun et al. |
| 2017/0040214 A1 | 2/2017 | Lai et al. |
| 2017/0053808 A1 | 2/2017 | Kamp et al. |
| 2017/0110335 A1 | 4/2017 | Yang et al. |
| 2017/0133202 A1 | 5/2017 | Berry |
| 2017/0178894 A1 | 6/2017 | Stone et al. |
| 2017/0178899 A1 | 6/2017 | Kabansky et al. |
| 2017/0207088 A1 | 7/2017 | Kwon et al. |
| 2017/0236694 A1 | 8/2017 | Eason et al. |
| 2017/0338133 A1 | 11/2017 | Tan et al. |
| 2017/0338134 A1 | 11/2017 | Tan et al. |
| 2018/0005850 A1 | 1/2018 | Citla et al. |
| 2018/0025900 A1 | 1/2018 | Park et al. |
| 2018/0069000 A1 | 3/2018 | Bergendahl et al. |
| 2018/0076031 A1 | 3/2018 | Yan et al. |
| 2018/0076044 A1 | 3/2018 | Choi et al. |
| 2018/0076083 A1 | 3/2018 | Ko et al. |
| 2018/0082861 A1 | 3/2018 | Citla et al. |
| 2018/0096818 A1 | 4/2018 | Lubomirsky |
| 2018/0096819 A1 | 4/2018 | Lubomirsky et al. |
| 2018/0096821 A1 | 4/2018 | Lubomirsky et al. |
| 2018/0096865 A1 | 4/2018 | Lubomirsky et al. |
| 2018/0102255 A1 | 4/2018 | Chen et al. |
| 2018/0102256 A1 | 4/2018 | Chen et al. |
| 2018/0102259 A1 | 4/2018 | Wang et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0182633 A1 | 6/2018 | Pandit et al. |
| 2018/0226223 A1 | 8/2018 | Lubomirsky |
| 2018/0226230 A1 | 8/2018 | Kobayashi et al. |
| 2018/0226259 A1 | 8/2018 | Choi et al. |
| 2018/0226278 A1 | 8/2018 | Arnepalli et al. |
| 2018/0226425 A1 | 8/2018 | Purayath |
| 2018/0226426 A1 | 8/2018 | Purayath |
| 2018/0240654 A1 | 8/2018 | Park et al. |
| 2018/0261516 A1 | 9/2018 | Lin et al. |
| 2018/0261686 A1 | 9/2018 | Lin et al. |

FOREIGN PATENT DOCUMENTS

| | | |
|---|---|---|
| JP | 63301051 A | 12/1988 |
| JP | H09-260356 A | 10/1997 |
| JP | 2001-332608 A | 11/2001 |
| JP | 2002-075972 A | 3/2002 |
| JP | 2003-282591 A | 10/2003 |
| JP | 2011-508436 A | 3/2011 |
| JP | 2016-111177 A | 6/2016 |
| KR | 10-2000-0064946 A | 11/2000 |
| KR | 10-2001-0056735 A | 7/2001 |
| KR | 10-2003-0083633 A | 10/2003 |
| KR | 10-2006-0127173 A | 12/2006 |
| KR | 100663668 B1 | 1/2007 |
| KR | 100678696 B1 | 1/2007 |
| KR | 10-0843236 B1 | 7/2008 |
| KR | 10-2010-0093358 A | 8/2010 |
| KR | 10-2011-0114538 A | 10/2011 |
| TW | 2006-12480 A | 4/2006 |
| TW | 200709256 A | 3/2007 |
| WO | 2009-009611 A2 | 1/2009 |
| WO | 2010-113946 A1 | 10/2010 |
| WO | 2011070945 A1 | 6/2011 |
| WO | 2011-095846 A1 | 8/2011 |
| WO | 2012-148568 A1 | 11/2012 |
| WO | 2013-118260 A1 | 8/2013 |

(56) References Cited

FOREIGN PATENT DOCUMENTS

OTHER PUBLICATIONS

International Search Report and Written Opinion of PCT/US2017/060696 dated Jan. 25, 2018, all pages.
International Search Report and Written Opinion of PCT/US2017/055431 dated Jan. 19, 2018, all pages.
International Search Report and Written Opinion of PCT/US2018/016261 dated May 21, 2018, all pages.
International Search Report and Written Opinion of PCT/US2018/016648 dated May 18, 2018, all pages.
International Search Report and Written Opinion of PCT/US2017/047209 dated Nov. 24, 2017, all pages.
International Search Report and Written Opinion of PCT/US2017/033362 dated Aug. 24, 2017, all pages.

\* cited by examiner

ATOMIC LAYER ETCHING PROCESSES

TECHNICAL FIELD

The present technology relates to semiconductor systems, processes, and equipment. More specifically, the present technology relates to systems and methods for removing material layers on a wafer surface.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Processing methods may be performed to remove unwanted materials from a substrate. The methods may include forming a remote plasma of an inert precursor in a remote plasma region of a processing chamber. The methods may include forming a bias plasma of the inert precursor within a processing region of the processing chamber. The methods may include modifying a surface of an exposed material on a semiconductor substrate within the processing region of the processing chamber with plasma effluents of the inert precursor. The methods may include extinguishing the bias plasma while maintaining the remote plasma. The methods may include adding an etchant precursor to the remote plasma region to produce etchant plasma effluents. The methods may include flowing the etchant plasma effluents to the processing region of the processing chamber. The methods may also include removing the modified surface of the exposed material from the semiconductor substrate.

In some embodiments, the inert precursor may include hydrogen or helium. The remote plasma region may include a region within the processing chamber separated from the processing region by a showerhead. The remote plasma region may be characterized by a smaller gap between electrodes within the processing chamber than the processing region. The methods may be performed at a chamber operating pressure below about 500 mTorr. The etchant precursor may include a fluorine-containing precursor or a nitrogen-containing precursor. The remote plasma may include a capacitively-coupled plasma. The remote plasma may be formed at an electrical frequency of greater than or about 40 MHz. The remote plasma may be formed at an electrical frequency less than or about 80 MHz. The methods may further include halting a flow of the etchant precursor while maintaining the remote plasma. The methods may also include forming a bias plasma in the processing region. The methods may also include modifying an additional amount of the exposed material. The operations of flowing and halting the flow of the etchant precursor may be performed for a plurality of cycles. The remote plasma may be maintained throughout the plurality of cycles.

The present technology may also encompass additional etching methods. The methods may include forming a first plasma within a remote plasma region of a processing chamber. The methods may include forming a second plasma within a processing region of the processing chamber. The methods may include modifying an exposed material on a semiconductor substrate within the processing region of the processing chamber with effluents of the second plasma. The methods may include extinguishing the second plasma while maintaining the first plasma. The methods may include providing an etchant precursor to the remote plasma region to form etchant plasma effluents. The methods may include etching the modified exposed material on the semiconductor substrate.

In some embodiments, the etching may be performed at a temperature of about 100° C. The remote plasma region of the processing chamber may be fluidly coupled with, and physically separated from, the processing region of the processing chamber. The first plasma may be a capacitively-coupled plasma operated at a power level of about 500 W or less. The first plasma may be a capacitively-coupled plasma operated at a frequency of about 40 MHz or more. The methods may also include halting a flow of the etchant precursor while maintaining the first plasma. The methods may include reforming the second plasma in the processing region of the processing chamber. The methods may include modifying an additional amount of the exposed material on the semiconductor substrate.

The present technology may also encompass additional etching methods. The methods may include striking a plasma of an inert precursor in a remote plasma region of a processing chamber. The remote plasma region may be characterized by a first gap between electrodes within the processing chamber. The methods may include striking a plasma of the inert precursor within a processing region of the processing chamber. The processing region of the processing chamber may be characterized by a second gap between electrodes within the processing chamber. The second gap between electrodes may be greater than the first gap between electrodes. The methods may also include modifying a surface of a semiconductor substrate within the processing region of the processing chamber with plasma effluents of the inert precursor. The methods may include extinguishing the plasma within the processing region of the processing chamber while maintaining the plasma in the remote plasma region. The methods may include flowing an etchant precursor to the remote plasma region to produce etchant plasma effluents. The methods may include flowing the etchant plasma effluents to the processing region of the processing chamber. The methods may also include removing the modified surface of the semiconductor substrate. In some embodiments, the plasma formed in the remote plasma region may be formed at a frequency of at least about 40 MHz.

Such technology may provide numerous benefits over conventional systems and techniques. For example, by maintaining a plasma in a remote region, pressure swings within the chamber region may be limited. Additionally, the higher frequency of plasma generation may allow the remote plasma to be formed at lower pressure. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
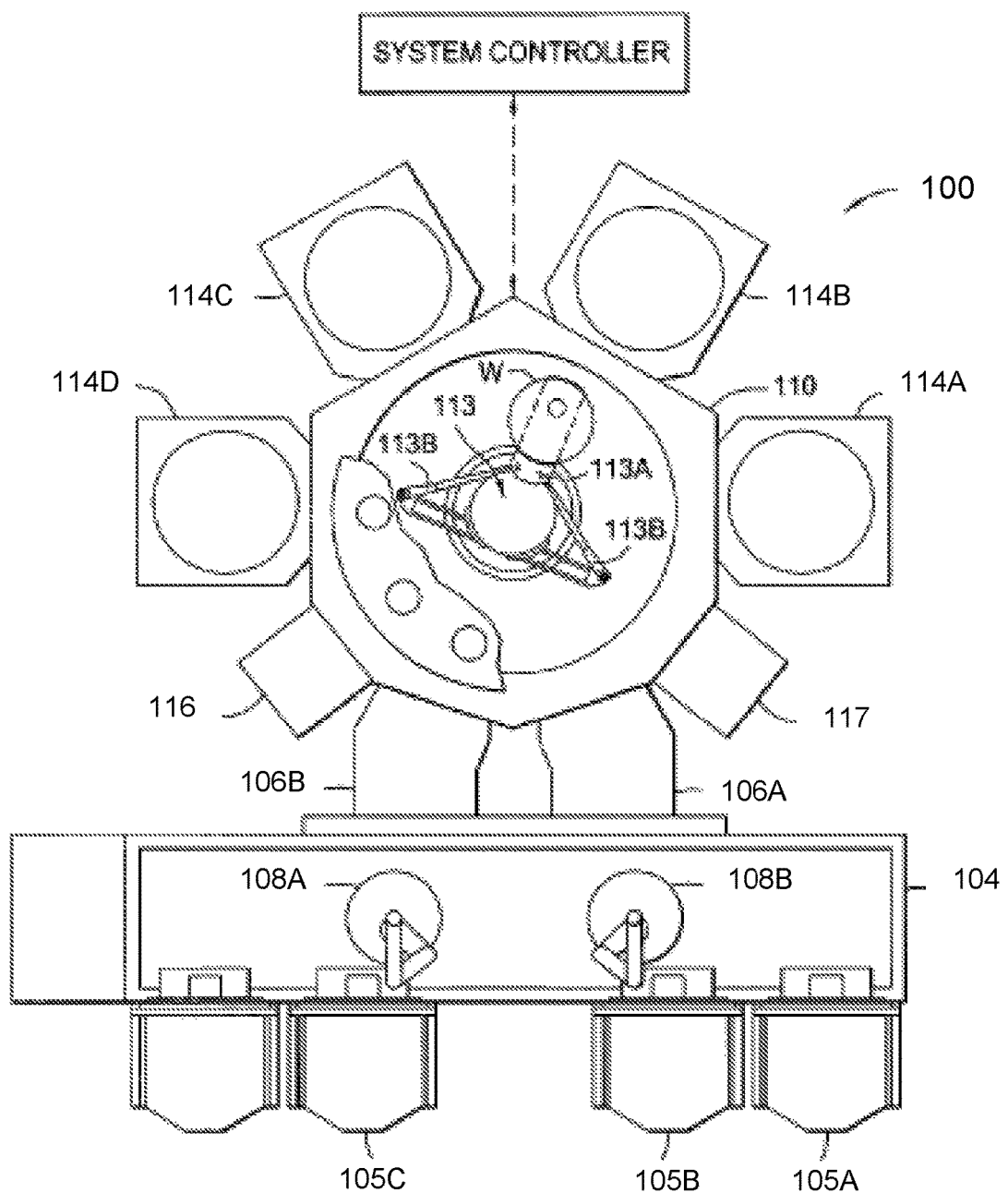
FIG. 1 shows a top plan view of an exemplary processing system according to the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing of small pitch features. As line pitch is reduced, standard lithography processes may be limited, and alternative mechanisms may be used in patterning. Conventional technologies have struggled with these minimal patterning and removal operations, especially when exposed materials on a substrate may include many different features and materials, some to be etched and some to be maintained.

Atomic layer etching is a process that utilizes a multiple-operation process of damaging or modifying a material surface followed by an etching operation. The etching operation may be performed at chamber conditions allowing the modified material to be removed, but limiting interaction with unmodified materials. This process may then be cycled any number of times to etch additional materials. Some chambers available can perform both operations within a single chamber. The modification may be performed with a bombardment operation at the substrate level, followed by a remote plasma operation to enhance etchant precursors capable of removing only the modified materials.

Because of the volumetric distribution within a chamber between regions formed between various components, one plasma region may be of greater volume than another, or the distance between the electrodes may be larger in one region than in another. For example, the distance between electrodes in the wafer-level plasma region may be greater than the distance between electrodes in the remote plasma region. This may affect the requirements for plasma formation within the regions. For example, according to the Paschen curve of various gases, the pressure within a system and gap between the electrodes may impact the breakdown voltage. When the electrode gap is fixed, as in a particular processing chamber, the pressure may be increased to generate plasma in a region defined between closer electrodes, and lowered when generating plasma in a region defined between electrodes farther apart.

Accordingly, continuing the example within the noted chamber, the pressure may be cycled back and forth between a lower pressure during the modification operation, and a higher pressure during the etching operation. Of course, this is only an example, and different chamber configurations may be characterized by the opposite pressure swing based on the chamber design. The pressure swing may be fairly dramatic in some conditions. For example, the modification operation may be performed at a pressure below 1 Torr, including below or about 100 mTorr, or below or about 50 mTorr. The etching operation may be performed at much higher pressure, such as above 1 Torr, including above or about 2 Torr, above or about 3 Torr, or more. Modulating the pressure between, say, 50 mTorr and 3 Torr may be a fairly drastic change which can cause multiple issues for the overall process.

A first issue may relate to queue times, or the time to process wafers. Although the pressure cycling may be performed in a relatively short time, such as between about 30 seconds or 1 minute, when the pressure is modulated twice in each cycle of the operation, if a process is performed for 10, 20, 30, 50 or more cycles, the increase in processing time due to pressure cycling can be hours. Additionally, the significant difference between the two pressure conditions may cause byproduct flow issues within a chamber. In some chambers materials removed from a substrate are purged from the chamber. The path of purge, such as below the substrate support, may collect an amount of particulate material or etching byproducts, which normally may not interfere with the processed substrate. However, when the pressure is cycled between the two operation points, the flow profile within the processing chamber may cause backflow of fluid, which may dislodge byproducts or other particulate materials, and deliver them back into the processing region, causing deposition on the substrate. These byproducts can cause many known problems, such as short circuiting of formed devices, or blocking of feature openings limiting later processing operations.

The present technology overcomes these issues by forming the remote plasma at higher frequency, which may allow the plasma to be generated at lower pressure. Accordingly, the pressure may be maintained between the two operations, reducing queue times of the etching processes. Additionally, in some embodiments the remote plasma may be maintained throughout the entire process while cycling only the substrate-level plasma. This may provide added benefits of limiting plasma striking in the remote region. For example, when striking a plasma, a higher voltage may be needed at initiation. This initial higher voltage can cause issues such as arcing, surface damage of chamber components, or sputtering of chamber surfaces. Once the plasma has been formed, however, maintaining the plasma may use lower voltage, which may limit these effects. Accordingly, by maintaining the remote plasma throughout the processes of some embodiments of the present technology, the particle generation and damage to chamber components may be reduced. Although a modification of the chamber may be performed, such as to increase the gap in the remote plasma region, such a modification to the chamber may cause additional issues. For example, as the gap increases, plasma characteristics may change, and affect the etchant produced. This may cause a reduction in selectivity or other etchant characteristics. Hence, the present technology may maintain a gap distribution, and may increase the frequency of the remote plasma generation.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone.

FIG. 1 shows a top plan view of one embodiment of a processing system 100 of deposition, etching, baking, and curing chambers according to embodiments. The processing tool 100 depicted in FIG. 1 may contain a plurality of process chambers, 114A-D, a transfer chamber 110, a service chamber 116, an integrated metrology chamber 117, and a pair of load lock chambers 106A-B. The process chambers may include structures or components similar to those described in relation to FIG. 2, as well as additional processing chambers.

To transport substrates among the chambers, the transfer chamber 110 may contain a robotic transport mechanism 113. The transport mechanism 113 may have a pair of substrate transport blades 113A attached to the distal ends of extendible arms 113B, respectively. The blades 113A may be used for carrying individual substrates to and from the process chambers. In operation, one of the substrate transport blades such as blade 113A of the transport mechanism 113 may retrieve a substrate W from one of the load lock chambers such as chambers 106A-B and carry substrate W to a first stage of processing, for example, an etching process as described below in chambers 114A-D. If the chamber is occupied, the robot may wait until the processing is complete and then remove the processed substrate from the chamber with one blade 113A and may insert a new substrate with a second blade (not shown). Once the substrate is processed, it may then be moved to a second stage of processing. For each move, the transport mechanism 113 generally may have one blade carrying a substrate and one blade empty to execute a substrate exchange. The transport mechanism 113 may wait at each chamber until an exchange can be accomplished.

Once processing is complete within the process chambers, the transport mechanism 113 may move the substrate W from the last process chamber and transport the substrate W to a cassette within the load lock chambers 106A-B. From the load lock chambers 106A-B, the substrate may move into a factory interface 104. The factory interface 104 generally may operate to transfer substrates between pod loaders 105A-D in an atmospheric pressure clean environment and the load lock chambers 106A-B. The clean environment in factory interface 104 may be generally provided through air filtration processes, such as HEPA filtration, for example. Factory interface 104 may also include a substrate orienter/aligner (not shown) that may be used to properly align the substrates prior to processing. At least one substrate robot, such as robots 108A-B, may be positioned in factory interface 104 to transport substrates between various positions/locations within factory interface 104 and to other locations in communication therewith. Robots 108A-B may be configured to travel along a track system within enclosure 104 from a first end to a second end of the factory interface 104.

The processing system 100 may further include an integrated metrology chamber 117 to provide control signals, which may provide adaptive control over any of the processes being performed in the processing chambers. The integrated metrology chamber 117 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Figure 2:
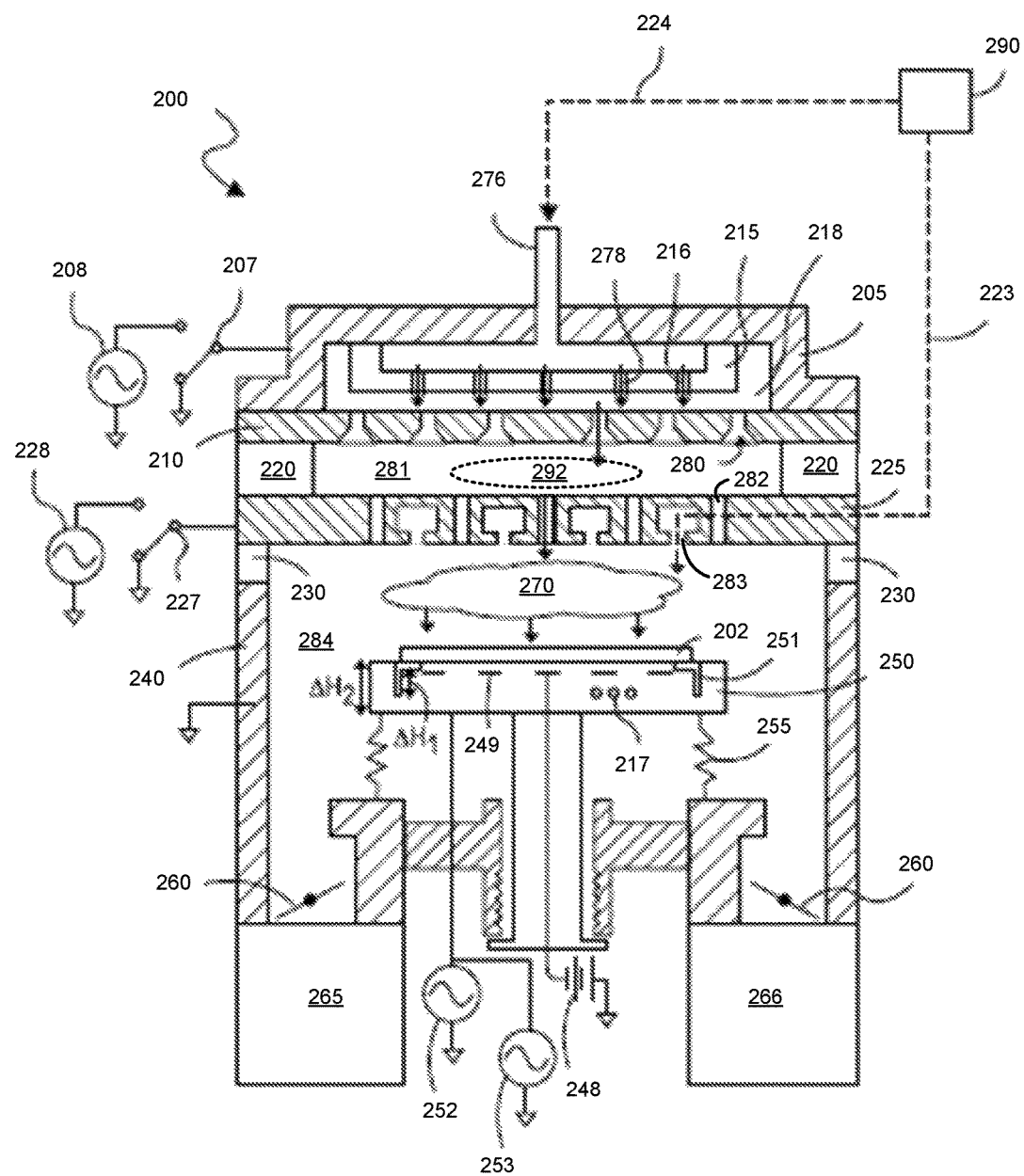
FIG. 2 shows a schematic cross-sectional view of an exemplary processing chamber according to the present technology.

Turning now to FIG. 2 is shown a cross-sectional view of an exemplary process chamber system 200 according to the present technology. Chamber 200 may be used, for example, in one or more of the processing chamber sections 114 of the system 100 previously discussed Generally, the etch chamber 200 may include a first capacitively-coupled plasma source to implement an ion milling operation and a second capacitively-coupled plasma source to implement an etching operation and to implement an optional deposition operation. The ion milling operation may also be called a modification operation. The chamber 200 may include grounded chamber walls 240 surrounding a chuck 250. In embodiments, the chuck 250 may be an electrostatic chuck that clamps the substrate 202 to a top surface of the chuck 250 during processing, though other clamping mechanisms as would be known may also be utilized. The chuck 250 may include an embedded heat exchanger coil 217. In the exemplary embodiment, the heat exchanger coil 217 includes one or more heat transfer fluid channels through which heat transfer fluid, such as an ethylene glycol/water mix, may be passed to control the temperature of the chuck 250 and ultimately the temperature of the substrate 202.

The chuck 250 may include a mesh 249 coupled to a high voltage DC supply 248 so that the mesh 249 may carry a DC bias potential to implement the electrostatic clamping of the substrate 202. The chuck 250 may be coupled with a first RF power source and in one such embodiment, the mesh 249 may be coupled with the first RF power source so that both the DC voltage offset and the RF voltage potentials are coupled across a thin dielectric layer on the top surface of the chuck 250. In the illustrative embodiment, the first RF power source may include a first and second RF generator 252, 253. The RF generators 252, 253 may operate at any industrially utilized frequency, however in the exemplary embodiment the RF generator 252 may operate at 60 MHz to provide advantageous directionality. Where a second RF generator 253 is also provided, the exemplary frequency may be 2 MHz.

With the chuck 250 to be RF powered, an RF return path may be provided by a first showerhead 225. The first showerhead 225 may be disposed above the chuck to distribute a first feed gas into a first chamber region 284 defined by the first showerhead 225 and the chamber wall 240. As such, the chuck 250 and the first showerhead 225 form a first RF coupled electrode pair to capacitively energize a first plasma 270 of a first feed gas within a first chamber region 284. A DC plasma bias, or RF bias, resulting from capacitive coupling of the RF powered chuck may generate an ion flux from the first plasma 270 to the substrate 202, e.g., Ar ions where the first feed gas is Ar, to provide an ion milling plasma. The first showerhead 225 may be grounded or alternately coupled with an RF source 228 having one or more generators operable at a frequency other than that of the chuck 250, e.g., 13.56 MHz or 60 MHz. In the illustrated embodiment the first showerhead 225 may be selectably coupled to ground or the RF source 228 through the relay 227 which may be automatically controlled during the etch process, for example by a controller (not shown). In disclosed embodiments, chamber 200 may not include showerhead 225 or dielectric spacer 220, and may instead include only baffle 215 and showerhead 210 described further below.

As further illustrated in the figure, the etch chamber 200 may include a pump stack capable of high throughput at low process pressures. In embodiments, at least one turbo molecular pump 265, 266 may be coupled with the first chamber region 284 through one or more gate valves 260 and disposed below the chuck 250, opposite the first showerhead 225. The turbo molecular pumps 265, 266 may be any commercially available pumps having suitable throughput and more particularly may be sized appropriately to maintain process pressures below or about 10 mTorr or below or about 5 mTorr at the desired flow rate of the first feed gas, e.g., 50 to 500 sccm of Ar where argon is the first feedgas. In the embodiment illustrated, the chuck 250 may form part of a pedestal which is centered between the two turbo pumps 265 and 266, however in alternate configurations chuck 250 may be on a pedestal cantilevered from the chamber wall 240 with a single turbo molecular pump having a center aligned with a center of the chuck 250.

Disposed above the first showerhead 225 may be a second showerhead 210. In one embodiment, during processing, the first feed gas source, for example, Argon delivered from gas distribution system 290 may be coupled with a gas inlet 276, and the first feed gas flowed through a plurality of apertures 280 extending through second showerhead 210, into the second chamber region 281, and through a plurality of apertures 282 extending through the first showerhead 225 into the first chamber region 284. An additional flow distributor or baffle 215 having apertures 278 may further distribute a first feed gas flow 216 across the diameter of the etch chamber 200 through a distribution region 218. In an alternate embodiment, the first feed gas may be flowed directly into the first chamber region 284 via apertures 283 which are isolated from the second chamber region 281 as denoted by dashed line 223.

Chamber 200 may additionally be reconfigured from the state illustrated to perform an etching operation. A secondary electrode 205 may be disposed above the first showerhead 225 with a second chamber region 281 there between. The secondary electrode 205 may further form a lid or top plate of the etch chamber 200. The secondary electrode 205 and the first showerhead 225 may be electrically isolated by a dielectric ring 220 and form a second RF coupled electrode pair to capacitively discharge a second plasma 292 of a second feed gas within the second chamber region 281. Advantageously, the second plasma 292 may not provide a significant RF bias potential on the chuck 250. At least one electrode of the second RF coupled electrode pair may be coupled with an RF source for energizing an etching plasma. The secondary electrode 205 may be electrically coupled with the second showerhead 210. In an exemplary embodiment, the first showerhead 225 may be coupled with a ground plane or floating and may be coupled to ground through a relay 227 allowing the first showerhead 225 to also be powered by the RF power source 228 during the ion milling mode of operation. Where the first showerhead 225 is grounded, an RF power source 208, having one or more RF generators operating at 13.56 MHz or 60 MHz, for example, may be coupled with the secondary electrode 205 through a relay 207 which may allow the secondary electrode 205 to also be grounded during other operational modes, such as during an ion milling operation, although the secondary electrode 205 may also be left floating if the first showerhead 225 is powered.

A second feed gas source, such as nitrogen trifluoride, and a hydrogen source, such as ammonia, may be delivered from gas distribution system 290, and coupled with the gas inlet 276 such as via dashed line 224. In this mode, the second feed gas may flow through the second showerhead 210 and may be energized in the second chamber region 281. Reactive species may then pass into the first chamber region 284 to react with the substrate 202. As further illustrated, for embodiments where the first showerhead 225 is a multi-channel showerhead, one or more feed gases may be provided to react with the reactive species generated by the second plasma 292. In one such embodiment, a water source may be coupled with the plurality of apertures 283. Additional configurations may also be based on the general illustration provided, but with various components reconfigured. For example, flow distributor or baffle 215 may be a plate similar to the second showerhead 210, and may be positioned between the secondary electrode 205 and the second showerhead 210. As any of these plates may operate as an electrode in various configurations for producing plasma, one or more annular or other shaped spacer may be positioned between one or more of these components, similar to dielectric ring 220. Second showerhead 210 may also operate as an ion suppression plate in embodiments, and may be configured to reduce, limit, or suppress the flow of ionic species through the second showerhead 210, while still allowing the flow of neutral and radical species. One or more additional showerheads or distributors may be included in the chamber between first showerhead 225 and chuck 250. Such a showerhead may take the shape or structure of any of the distribution plates or structures previously described. Also, in embodiments a remote plasma unit (not shown) may be coupled with the gas inlet to provide plasma effluents to the chamber for use in various processes.

In an embodiment, the chuck 250 may be movable along the distance H2 in a direction normal to the first showerhead 225. The chuck 250 may be on an actuated mechanism surrounded by a bellows 255, or the like, to allow the chuck 250 to move closer to or farther from the first showerhead 225 as a means of controlling heat transfer between the chuck 250 and the first showerhead 225, which may be at an elevated temperature of 80° C.-150° C., or more. As such, an etch process may be implemented by moving the chuck 250 between first and second predetermined positions relative to the first showerhead 225. Alternatively, the chuck 250 may include a lifter 251 to elevate the substrate 202 off a top surface of the chuck 250 by distance H1 to control heating by the first showerhead 225 during the etch process. In other embodiments, where the etch process is performed at a fixed temperature such as about 90-110° C. for example, chuck displacement mechanisms may be avoided. A system controller (not shown) may alternately energize the first and second plasmas 270 and 292 during the etching process by alternately powering the first and second RF coupled electrode pairs automatically.

The chamber 200 may also be reconfigured to perform a deposition operation. A plasma 292 may be generated in the second chamber region 281 by an RF discharge which may be implemented in any of the manners described for the second plasma 292. Where the first showerhead 225 is powered to generate the plasma 292 during a deposition, the first showerhead 225 may be isolated from a grounded chamber wall 240 by a dielectric spacer 230 so as to be electrically floating relative to the chamber wall. In the exemplary embodiment, an oxidizer feed gas source, such as molecular oxygen, may be delivered from gas distribution system 290, and coupled with the gas inlet 276. In embodiments where the first showerhead 225 is a multi-channel showerhead, any silicon-containing precursor, such as OMCTS for example, may be delivered from gas distribution system 290, and directed into the first chamber region 284 to react with reactive species passing through the first showerhead 225 from the plasma 292. Alternatively the silicon-containing precursor may also be flowed through the gas inlet 276 along with the oxidizer. Chamber 200 is included as a general chamber configuration that may be utilized for various operations discussed in reference to the present technology. The chamber is not to be considered limiting to the technology, but instead to aid in understanding of the processes described. Several other chambers known in the art or being developed may be utilized with the present technology including any chamber produced by Applied Materials Inc. of Santa Clara, Calif., or any chamber that may perform the techniques described in more detail below.

Figure 3:
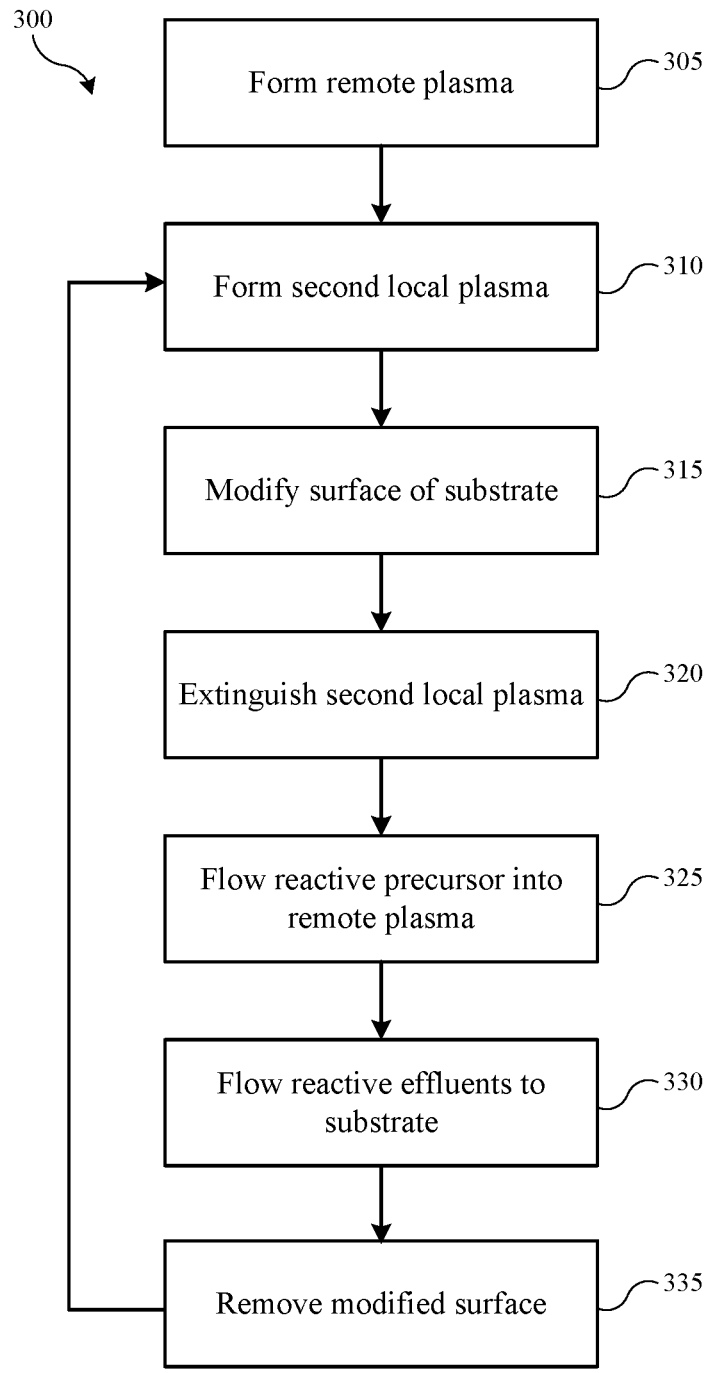
FIG. 3 shows selected operations in an etching method according to embodiments of the present technology.

FIG. 3 illustrates an etching method 300 that may be performed, for example, in the chamber 200 as previously described. The method may also be performed in any other chamber in which a substrate-level plasma may be formed as well as a plasma within a remote plasma region may be formed. Method 300 may include one or more operations prior to the initiation of the method, including front end processing, deposition, etching, polishing, cleaning, or any other operations that may be performed prior to the described operations. A processed substrate, which may be a semiconductor wafer of any size, may be positioned within a chamber for the method 300. In embodiments the operations of method 300 may be performed in multiple chambers depending on the operations being performed. Additionally, in embodiments the entire method 300 may be performed in a single chamber to reduce queue times, contamination issues, and vacuum break. Subsequent operations to those discussed with respect to method 300 may also be performed in the same chamber or in different chambers as would be readily appreciated by the skilled artisan.

Method 300 may include forming an inert plasma within a remote plasma region of a semiconductor processing chamber at operation 305. The remote plasma may be a first plasma in embodiments. A substrate may already be positioned within the chamber prior to operation 305. With reference to chamber 200 for illustration purposes only, the plasma may be formed or generated in region 292, or within a region separated from the processing region in which the substrate resides. The separation may be with an electrode, allowing containment of the plasma formed. Method 300 may also include forming a plasma at the substrate level within the processing region of the chamber at operation 310, or within a region defined at least in part by the substrate support pedestal. Such a plasma is similarly understood to be a local plasma or wafer-level plasma, and may be a second plasma in embodiments of the present technology.

In some embodiments, both the remote plasma and the wafer-level plasma may be capacitively-coupled plasmas. In some embodiments the wafer-level plasma may be a bias plasma formed within the processing region of the chamber. The wafer-level plasma may be formed from the same inert precursor as the remote plasma, and may include plasma effluents that may flow from the remote plasma region into the processing region. The second plasma region may be used to produce ions or other effluents of the inert plasma in method 300 for modifying a surface of an exposed material on a semiconductor substrate at operation 315. Accordingly, plasma may be formed in both the remote plasma region and the processing region during some embodiments of method 300.

Subsequent the surface modification of the exposed material on the substrate surface, the second plasma, or the wafer-level plasma, may be extinguished at operation 320. While the second plasma may be extinguished, the first plasma or remote plasma may be maintained. Maintaining the remote plasma may be performed by maintaining a flow of an inert precursor throughout the method, which may allow the remote plasma to be sustained. Ions developed in the remote plasma may be filtered by an ion suppressor, as will be discussed below. As explained previously, by maintaining the first plasma, effects of cycling the striking of the first plasma may be reduced or eliminated.

Method 300 may also include adding an etchant precursor, which may involve flowing an etchant precursor to the remote plasma region at operation 325, while the remote plasma is maintained. Maintaining the first plasma may include a controlled switching of precursor delivery, as well as a compensating effect in which the inert precursor may be reduced or adjusted while the etchant precursor may be added. The remote plasma may produce etchant plasma effluents, and the etchant precursor may include or be composed of a fluorine-containing precursor. In embodiments, the plasma utilized in operation 325 may also be formed at the wafer level, but a remote plasma may reduce a sputtering component at the wafer and from the chamber components. The etchant plasma effluents may be flowed through the processing chamber to the processing region of the semiconductor processing chamber where the substrate is housed at operation 330. Upon contacting the modified surface, the etchant plasma effluents may remove the modified surface of the exposed material from the semiconductor substrate at operation 335.

The modifying and removal operations of method 300 may allow a controlled removal of unwanted materials, which may include oxides, nitrides, or other materials from the substrate. The operations may also be well suited for any size features, including small pitch features, or where the width between successive features for example, is less than or about 50 nm, less than or about 25 nm, less than or about 20 nm, less than or about 15 nm, less than or about 12 nm, less than or about 10 nm, less than or about 9 nm, less than or about 8 nm, less than or about 7 nm, less than or about 6 nm, less than or about 5 nm, less than or about 4 nm, less than or about 3 nm, less than or about 2 nm, less than or about 1 nm, or smaller. The modifying and removal operations may be performed successively in multiple chambers or in a single chamber, such as, for example, chamber 200, that may produce both wafer-level plasmas and remote plasmas within the chamber, or in association with the chamber.

The modifying operation 315 may involve an inert plasma of one or more materials. The material used to produce the plasma may be one or more noble materials including helium, neon, argon, krypton, xenon, or radon. The material used to produce the plasma may also be additional materials that may have limited chemical activity or be unreactive with the exposed material on the semiconductor surface being modified. For example, hydrogen may be used in operations 305-315, and in embodiments the inert plasma may either comprise or consist of a hydrogen plasma or a helium plasma. The hydrogen plasma may be generated from any number of hydrogen containing materials or mixtures, and may be formed exclusively of hydrogen ($H_2$) in embodiments. The modifying operation may involve a form of bombardment of the material to be removed. With hydrogen being a small, light material, it may be less likely to sputter the material at which it is being directed than heavier materials such as, for example, helium. In other embodiments, helium may be used to allow modification of stronger bonding structures, which may be broken by heavier ions.

The plasma formed from the inert precursor may be a bias plasma providing directional flow of plasma effluents to the substrate. The plasma may be a low-level plasma to limit the amount of bombardment, sputtering, and surface modification. In embodiments the plasma power may be less than or about 300 W, less than or about 250 W, less than or about 200 W, less than or about 150 W, less than or about 100 W, less than or about 75 W, less than or about 50 W, or less than or about 25 W. By utilizing a plasma power that is, for example, about 50 W, the depth of penetration of the plasma effluents may be limited. For example, modification operations as described, may allow the surface of the exposed material on the semiconductor substrate to be modified to a depth from the exposed surface within the semiconductor substrate of less than or about 4 nm, and may allow modification of the surface of materials to a depth of less than or about 3 nm, less than or about 2 nm, or less than or about 1 nm. For example, by utilizing the low-level plasma, such as at about 50 W, and a relatively light precursor such as hydrogen, the saturation depth of penetration may be around 1 nm in embodiments. The modification operation may be relatively or completely insensitive to temperature and material, and may modify or damage exposed regions of nitride, oxide, or polysilicon almost equally, and may also modify metal-containing materials similarly.

The pressure within the processing chamber may be controlled during the method 300 as well. For example, while forming the inert plasma and performing the modification operation, the pressure within the processing chamber may be maintained below or about 1 Torr. Additionally, in embodiments, the pressure within the processing chamber may be maintained below or about 500 mTorr, below or about 250 mTorr, below or about 200 mTorr, below or about 150 mTorr, below or about 100 mTorr, below or about 80 mTorr, below or about 60 mTorr, below or about 50 mTorr, below or about 40 mTorr, below or about 30 mTorr, below or about 20 mTorr, below or about 10 mTorr, or lower. The pressure within the chamber may affect the directionality of the modification operation 315. For example, as pressure is increased, the modification process may become more isotropic, and as the pressure is reduced, the modification process may become more anisotropic. Thus, as pressure is increased, vertical structure sidewalls may begin to be treated as well, which after removal can remove material beyond what was originally desired in certain operations. Accordingly, in embodiments the pressure may be maintained between about 10 mTorr and about 150 mTorr, for example, to maintain a relatively or substantially anisotropic profile of the modification operation.

The plasma utilized in the removal operation may be formed remotely from the processing region of the semiconductor processing chamber. For example, the plasma may be formed in a region of the semiconductor processing chamber that is fluidly isolated from the processing region of the semiconductor processing chamber. Thus, the region may be physically separated from the processing region, while being fluidly coupled with the processing region. For example, in the exemplary chamber of FIG. 2, the remote plasma may be generated in region 292, which is separated from the processing region by showerhead 225. Additionally, the remote plasma may be formed in a remote plasma unit, such as an RPS unit that is separate from the chamber, but fluidly coupled with the chamber to deliver plasma effluents into the chamber, such as through a lid, top plate, or showerhead.

The remote plasma may be formed from one or more etchant precursors including a fluorine-containing precursor. The fluorine-containing precursor may include one or more materials including $NF_3$, HF, $F_2$, $CF_4$, $CHF_3$, $C_2F_6$, $C_3F_6$, $BrF_3$, $ClF_3$, $SF_6$, or additional fluorine-substituted hydrocarbons, or fluorine-containing materials. In embodiments the etchant precursor may also be or include a nitrogen-containing precursor. The fluorine-containing precursor may be flowed into the remote plasma region to generate plasma effluents, such as fluorine-containing plasma effluents. A source of hydrogen may also be incorporated as an etchant precursor, and may include hydrogen, ammonia, or any other incompletely substituted hydrocarbon, or other hydrogen-containing material. Sources of oxygen may also be utilized in some etching operations, which may include oxygen, ozone, nitrogen-and-oxygen-containing materials, oxygen-and-hydrogen-containing materials, or other fluids including oxygen. In some embodiments, one or more precursors may bypass the remote plasma region and be delivered into the processing region where the precursor may interact with the fluorine-containing plasma effluents. In either scenario, the plasma effluents may be delivered to the processing region of the semiconductor processing chamber where they may contact or interact with the modified material on the semiconductor substrate.

As previously discussed, forming a plasma in a region in which the electrodes are closer, may conventionally require increasing the pressure within the processing chamber. Although in some embodiments the pressure within the processing chamber may be increased during the etching operations, in some embodiments the pressure may be maintained in any of the ranges described above, such as below or about 100 mTorr. The present technology may differ from other conventional designs to allow formation or maintenance of plasma at these pressures within a smaller gap region of the processing chamber. While some conventional technologies would be incapable of maintaining plasma at the noted pressures when the plasma is generated at a frequency of 13.56 MHz, the present technology may form the plasma at higher frequency to allow formation at lower pressure.

In some embodiments, the present technology may form the remote plasma at operation 305 at a frequency above or about 30 MHz, and may form the remote plasma at a frequency of above or about 40 MHz, above or about 50 MHz, above or about 60 MHz, above or about 70 MHz, above or about 80 MHz, above or about 90 MHz, above or about 100 MHz, or higher. In some embodiments the plasma may be formed between about 40 MHz and about 80 MHz. Frequencies below about 40 MHz may be incapable of maintaining a plasma at pressures of less than 1 Torr, or less than 500 mTorr, or less than 200 mTorr. Additionally, at higher frequencies, current may transfer and cause issues with other components. For example, as the frequency increases above 60 MHz, or above 80 MHz, current generated may more easily flow to other lines in the system, which can damage subsystem power supplies or cause other issues.

Increasing the frequency at which the plasma is generated in the remote region may also provide additional benefits. For example, theoretically, forming the plasma at lower pressures is likely to reduce the radical concentration of the etchants. However, increasing the frequency to above or about 40 MHz, for example, may compensate for the reduction and may increase the radical concentration within the plasma effluents formed. Additionally, increasing the frequency may allow the dissociation to be performed at lower power. For example, to create a certain plasma profile at a frequency of 13.56 MHz, the plasma may be generated at a power of from about 300 W to about 1 kW or more. However, when the frequency is above or about 40 MHz, the same profile may be produced at a power of from about 80 W to about 200 W, or less.

As previously discussed, the precursors and plasma effluents may be effective at removing oxide and/or nitride, or other previously noted materials, in various semiconductor processes. Selective removal, however, may be affected by processing temperatures. Lower chamber temperatures may allow increased etching of one or more materials. In processes utilizing a fluorine-containing precursor and also a hydrogen-containing precursor to etch oxide materials, for example only, the process may involve performing an etch with plasma effluents, or with alternative precursors such as HF, at a low temperature, such as below about 50° C. or lower, to form solid byproducts on the surface of the material being removed. The procedure may then involve heating the materials above around 100° C. in order to sublimate the solid byproducts, which may include ammonium fluorosilicate, for example.

The present technology, however, may perform the removal processes at a semiconductor substrate or semiconductor chamber temperature of above or about 50° C., above or about 60° C., above or about 70° C., above or about 80° C., above or about 90° C., above or about 100° C., above or about 110° C., above or about 120° C., above or about 130° C., above or about 140° C., or above or about 150° C. An etching process utilizing the precursors discussed above may have limited capability, or may not etch certain materials at all at a temperature of about 100° C., for example. While conventional technologies may avoid such temperatures as they may prevent the desired removal, the present technology can utilize this benefit to provide a self-limiting stop on the etching operation. Although unmodified oxide and nitride materials may not etch with the removal process described at a temperature of 100° C., the modified materials produced may etch at a sufficient rate to remove the unwanted materials.

Thus, once the modified portion of the exposed materials has been removed, the underlying unmodified materials may not etch, or may have limited etching, and may effectively halt the etching process. In this way, minute amounts of material may be removed without overly attacking thin semiconductor layers or small pitch features. Accordingly, in embodiments, removing the modified surface of the exposed material may expose an unmodified portion of the material. An etching selectivity of a modified portion of the material to an unmodified portion of the material may be greater than or about 10:1. Depending on the material being etched, an etching selectivity of a modified portion of the material to an unmodified portion of the material may be greater than or about 20:1, 40:1, 100:1, 1,000:1, 10,000:1, up to about 1:0 at which point the modified portion of the material etches, but an unmodified portion of the material does not etch. The modification operation may produce an amount of dangling bonds and reactive sites for the modified material, which may allow the removal operation to occur under conditions at which the removal may not otherwise occur, or may occur at substantially reduced rates and selectivities for unmodified materials.

As previously explained, the modification operations may be performed at a relatively low plasma power level to create a depth of penetration within the exposed material surfaces of a few nanometers or less, such as about 1 nm to about 2 nm. Because the removal operation can be limited to essentially only remove modified surfaces, or have limited impact on unmodified surfaces, the removal operation may be limited to the modified region, and thus remove about 1 nm, about 2 nm, about 3 nm, or about 4 nm of material. The modification operation may have a saturation depth of about 1 nm in embodiments, but an amount of modification or penetration may occur to up to 2 nm, up to 3 nm, or up to 4 nm, although the saturation depth may be much less. However, the removal operation may continue to etch partially modified regions of material, and thus the removal operation may remove slightly more material than the saturation depth of the modification.

To ensure removal of all unwanted material from a substrate, the modification and removal operations may be performed in cycles to allow removal to a depth beyond the typical saturation depth of the modification operation. Accordingly, in embodiments, method 300 may be performed for 1 cycle, 3 cycles, 5 cycles, 10 cycles, 30 cycles, 50 cycles, or more in order to fully remove a material from a substrate. For various removals, the fine-tune control over the material removal based on a saturation depth of the modification operation may allow about 1 nm, about 2 nm, about 3 nm, or about 4 nm to be removed each cycle. The cycle may not include all operations of method 300. For example, after the material removal, the method may include halting a flow of the etchant precursor while maintaining the remote plasma. The method may then return to operation 310, and generate the second plasma, which may be a bias plasma, and modify an additional amount of the exposed material. The other operations of method 300 may similarly be repeated. Across all cycles, the remote plasma may be maintained. Accordingly, by cycling the wafer-level plasma and the introduction of the etchant precursors, the present technology may provide improved etching processes.

In this way, within 1 cycle, within 2 cycles, within 3 cycles, or within about 4 cycles the entire material may be removed from the substrate at a total removal after all cycles of less than or about 20 nm, less than or about 15 nm, less than or about 12 nm, less than or about 11 nm, less than or about 10 nm, less than or about 9 nm, less than or about 8 nm, less than or about 7 nm, less than or about 6 nm, less than or about 5 nm, less than or about 4 nm, less than or about 3 nm, less than or about 2 nm, or less than or about 1 nm. The operations are being discussed with respect to a limited amount of removal, but the techniques can also be used to remove additional material by, for example, causing the modification to occur to a lower depth, increasing the number of cycles, or by adjusting etching parameters including temperature. However, for limiting the amount of removal in many semiconductor processing operations, the low-power bias plasma with precursors such as previously discussed may allow limited material to be removed with each cycle.

Figure 4A:
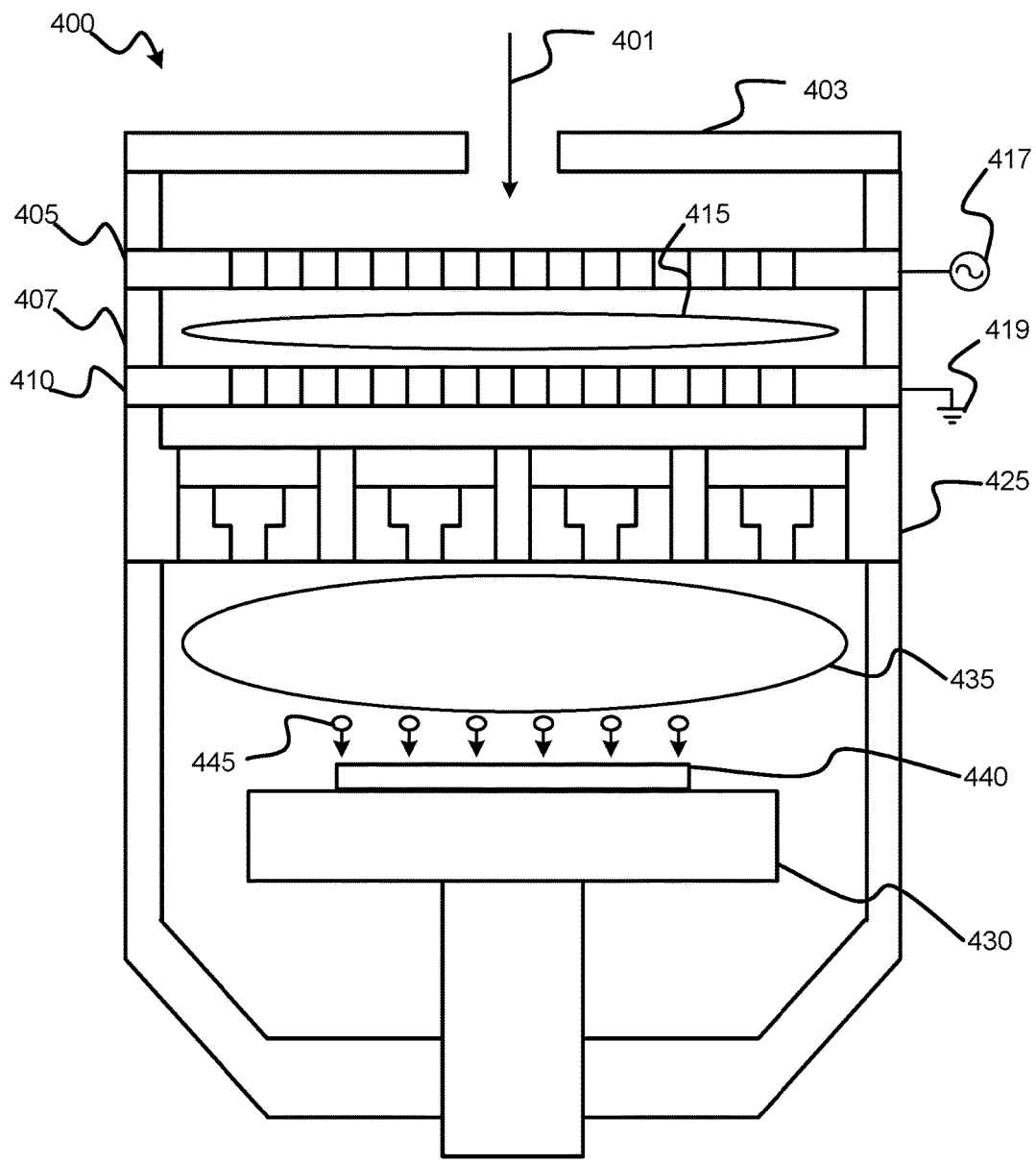
FIGS. 4A-4B illustrate schematic cross-sectional views of substrate processing chambers in which selected operations may be performed according to embodiments of the present technology.
Figure 4B:
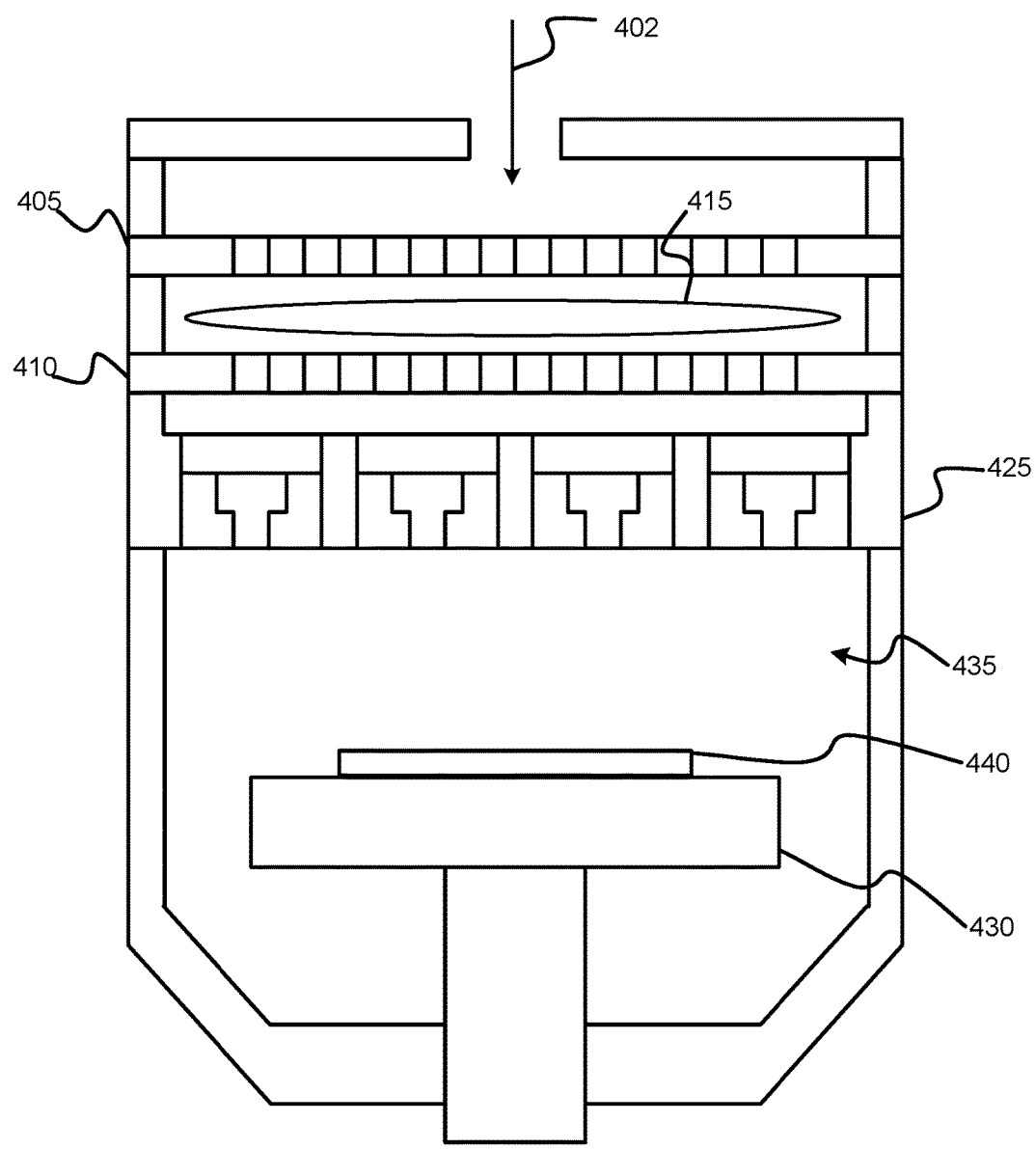

Turning to FIGS. 4A-4B is illustrated schematic cross-sectional views of an exemplary semiconductor processing chamber 400 in which operations of the present technology are being performed. As shown in FIG. 4A, chamber 400 may include a faceplate 405 through which inert precursors and/or etchant precursors may be distributed. Chamber 400 may include a lid 403, which may facilitate precursor distribution. Although a single inlet is illustrated for chamber 400, additional inlets may be included to allow introduction of multiple precursors in different patterns. Chamber 400 may include an ion suppressor 410, which may allow filtering of generated ions. In some embodiments, as illustrated, faceplate 405 and ion suppressor 410 may operate as electrodes to generate a plasma within a first plasma region 415. An RF source 417 may be coupled with faceplate 405, while ion suppressor 419 may be grounded in embodiments. Accordingly, an insert 407, such as a dielectric material, may be positioned between the faceplate 405 and ion suppressor 410 to allow formation of a plasma to occur.

Chamber 400 may or may not include a showerhead 425 in embodiments. Showerhead 425 may allow introduction of additional precursors, and may also aid in uniform distribution of precursors through the processing chamber 400. Showerhead 425 may also partially define a second plasma region 435 with substrate support 430. For example, a bias plasma may be formed between showerhead 425 and substrate support 430 on which a substrate 440 may be positioned. During operation, a plasma may be struck in both the first plasma region 415 and the second plasma region 435 from an inert precursor 401 delivered into the chamber, or a precursor that may not chemically react, or may have limited chemical reaction with an exposed material on substrate 440. Although ions formed in first plasma region 415 may be filtered by ion suppressor 410, ions 445 may be developed in second plasma region 435. Ions 445 may be developed to perform the modification of the exposed materials as previously described.

As discussed above, first plasma region 415 may be characterized by a first gap distance defined between the electrodes, which may be faceplate 405 and ion suppressor 410. Additionally, second plasma region 435 may be characterized by a second gap distance defined between the electrodes, which may be showerhead 425 and substrate support 430. In some embodiments, the first gap distance may be less than the second gap distance. Accordingly, to produce plasma within the region at similar operating pressures, first plasma region 415 may be coupled with a source that provides power at a frequency of at least about 40 MHz to allow formation at pressures described previously. Thus, plasma may be formed in both regions simultaneously during methods of the present technology.

Subsequent a first period of time during which the modification operation is performed, plasma within second plasma region 435 may be extinguished, while plasma is maintained in first plasma region 415, as illustrated in FIG. 4B. An etchant precursor 402 may be delivered into processing chamber 400 and into first plasma region 415, along with the inert precursor 401 in some embodiments, which may allow the plasma to be maintained in the first plasma region 415. Because ions may be filtered from plasma effluents by ion suppressor 410, the inert precursor may continue to flow without further modifying materials on substrate 440.

Etchant plasma effluents may be flowed from first plasma region 415, without further enhancement in second plasma region 435. The plasma effluents may contact the modified material on substrate 440, and may remove the materials from the substrate. In some embodiments, the operations may be repeated to modify and remove additional material from the substrate. During each cycle, the first plasma may be maintained within the remote plasma region. The modification and etching operations may be performed for any length of time, which may be similar or different in methods encompassed by the present technology. For example, either or both operations may be performed for a period of time greater than or about 1 second, greater than or about 5 seconds, greater than or about 10 seconds, greater than or about 20 seconds, greater than or about 30 seconds, greater than or about 40 seconds, greater than or about 50 seconds, greater than or about 60 seconds, or more. By maintaining the plasma in the first plasma region 415 throughout the operations performed, many of the issues described elsewhere can be avoided, while providing the discussed benefits.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
    forming a remote plasma of an inert precursor in a remote plasma region of a processing chamber, wherein the inert precursor is hydrogen or a noble gas;
    forming a bias plasma of the inert precursor within a processing region of the processing chamber;
    modifying a surface of an exposed material on a semiconductor substrate within the processing region of the processing chamber with plasma effluents of the inert precursor, wherein the remote plasma is maintained during the forming a bias plasma and the modifying a surface of an exposed material;
    extinguishing the bias plasma while maintaining the remote plasma subsequent the modifying a surface of an exposed material;
    adding an etchant precursor to the remote plasma region to produce etchant plasma effluents;
    flowing the etchant plasma effluents to the processing region of the processing chamber; and
    removing the modified surface of the exposed material from the semiconductor substrate.

2. The etching method of claim 1, wherein the inert precursor comprises hydrogen or helium.

3. The etching method of claim 1, wherein the remote plasma region comprises a region within the processing chamber separated from the processing region by a showerhead.

4. The etching method of claim 3, wherein the remote plasma region is characterized by a smaller gap between electrodes within the processing chamber than the processing region.

5. The etching method of claim 1, wherein the method is performed at a chamber operating pressure below about 500 mTorr.

6. The etching method of claim 1, wherein the etchant precursor comprises a fluorine-containing precursor or a nitrogen-containing precursor.

7. The etching method of claim 1, wherein the remote plasma comprises a capacitively-coupled plasma.

8. The etching method of claim 7, wherein the remote plasma is formed at an electrical frequency of greater than or about 40 MHz.

9. The etching method of claim 8, wherein the remote plasma is formed at an electrical frequency less than or about 80 MHz.

10. The etching method of claim 1, further comprising:
    halting a flow of the etchant precursor while maintaining the remote plasma;
    forming a bias plasma in the processing region; and
    modifying an additional amount of the exposed material.

11. The etching method of claim 10, wherein flowing and halting the flow of the etchant precursor is performed for a plurality of cycles.

12. The etching method of claim 11, wherein the remote plasma is maintained throughout the plurality of cycles.

13. An etching method comprising:
    forming a first plasma within a remote plasma region of a processing chamber;
    forming a second plasma within a processing region of the processing chamber;
    modifying an exposed material on a semiconductor substrate within the processing region of the processing chamber with effluents of the second plasma;
    extinguishing the second plasma while maintaining the first plasma;
    providing an etchant precursor to the remote plasma region to form etchant plasma effluents;
    etching the modified exposed material on the semiconductor substrate;
    halting a flow of the etchant precursor while maintaining the first plasma;
    reforming the second plasma in the processing region of the processing chamber; and
    modifying an additional amount of the exposed material on the semiconductor substrate.

14. The etching method of claim 13, wherein the etching is performed at a temperature of about 100° C.

15. The etching method of claim 13, wherein the remote plasma region of the processing chamber is fluidly coupled with, and physically separated from, the processing region of the processing chamber.

16. The etching method of claim 15, wherein the first plasma is a capacitively-coupled plasma operated at a power level of about 500 W or less.

17. The etching method of claim 15, wherein the first plasma is a capacitively-coupled plasma operated at a frequency of about 40 MHz or more.

18. An etching method comprising:
    striking a plasma of an inert precursor in a remote plasma region of a processing chamber, wherein the remote plasma region is characterized by a first gap between electrodes within the processing chamber, wherein the inert precursor is hydrogen or a noble gas;
    striking a plasma of the inert precursor within a processing region of the processing chamber, wherein the processing region of the processing chamber is characterized by a second gap between electrodes within the processing chamber, wherein the second gap between electrodes is greater than the first gap between electrodes, and wherein the striking a plasma of the inert precursor within the processing region occurs while maintaining the plasma of the inert precursor in the remote plasma region;
    modifying a surface of a semiconductor substrate within the processing region of the processing chamber with plasma effluents of the inert precursor, while continuing to maintain the plasma of the inert precursor in the remote plasma region;
    extinguishing the plasma within the processing region of the processing chamber while maintaining the plasma in the remote plasma region subsequent the modifying the surface of the semiconductor substrate;
    flowing an etchant precursor to the remote plasma region to produce etchant plasma effluents;
    flowing the etchant plasma effluents to the processing region of the processing chamber; and
    removing the modified surface of the semiconductor substrate.

19. The etching method of claim 18, wherein the plasma formed in the remote plasma region is formed at a frequency of at least about 40 MHz.

* * * * *